(12) United States Patent
Lau

(10) Patent No.: US 10,748,794 B1
(45) Date of Patent: Aug. 18, 2020

(54) APPARATUS FOR TRANSFERRING ELECTRONIC DEVICES

(71) Applicant: ASM Technology Singapore Pte Ltd, Singapore (SG)

(72) Inventor: Kai Fung Lau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/505,830

(22) Filed: Jul. 9, 2019

(51) Int. Cl.
*H01L 21/67* (2006.01)
*H01L 21/68* (2006.01)
*B65G 47/84* (2006.01)

(52) U.S. Cl.
CPC ...... *H01L 21/67144* (2013.01); *B65G 47/846* (2013.01); *H01L 21/67288* (2013.01); *H01L 21/681* (2013.01)

(58) Field of Classification Search
CPC .................................................. B65G 47/846

USPC .................................................... 414/223.01
See application file for complete search history.

(56) References Cited

U.S. PATENT DOCUMENTS

| 9,218,995 B2 * | 12/2015 | Cheng ............... H01L 21/67718 |
| 9,606,171 B2 * | 3/2017 | Cheung ............... G01R 31/2893 |
| 10,056,278 B2 * | 8/2018 | Cheng ............... H01L 21/67721 |
| 2019/0139795 A1 * | 5/2019 | Neo ....................... B65G 47/848 |

\* cited by examiner

*Primary Examiner* — Ronald P Jarrett
(74) *Attorney, Agent, or Firm* — Ostrolenk Faber LLP

(57) ABSTRACT

An apparatus for transferring electronic components, comprising a main rotary turret comprising a plurality of turret pick heads for conveying electronic components to multiple positions adjacent to the main rotary turret; a first rotary mechanism configured for picking up electronic components from a supply of electronic components, the first rotary mechanism being in operative communication with the main rotary turret at a first transfer position; and a second rotary mechanism that is in operative communication with the main rotary turret at a second transfer position, and which is further in operative communication with the first rotary mechanism at a third transfer position.

13 Claims, 4 Drawing Sheets

APPARATUS FOR TRANSFERRING ELECTRONIC DEVICES

FIELD OF THE INVENTION

The present invention relates to an apparatus and method for transferring electronic components from a supply area to a processing station.

BACKGROUND

Electronic devices may be formed on a semiconductor wafer, which is subsequently diced into individual electronic components. After dicing, the individual electronic components are mounted on an elastic film, usually an elastic adhesive film, with their leads or electrical contacts facing away from the elastic film. After picking up these electronic components from the elastic film, the electronic components may have to be flipped so that subsequent processes such as functional testing or visual integrity checking can be performed on them.

A conventional apparatus for flipping the electronic components comprises a wheel that picks up an electronic component and rotates it 180°, thus flipping it for a subsequent process. However, the conventional apparatus would not be useful in a process that requires the electronic component to be flipped more than once.

SUMMARY OF THE INVENTION

It is thus an object of the invention to seek to provide an improved apparatus for transferring electronic components from a supply area to a processing station, with the capability to flip electronic components more than once.

According to a first aspect of the present invention, there is provided an apparatus for transferring electronic components, comprising a main rotary turret comprising a plurality of turret pick heads for conveying electronic components to multiple positions adjacent to the main rotary turret; a first rotary mechanism configured for picking up electronic components from a supply of electronic components, the first rotary mechanism being in operative communication with the main rotary turret at a first transfer position; and a second rotary mechanism that is in operative communication with the main rotary turret at a second transfer position, and which is further in operative communication with the first rotary mechanism at a third transfer position.

According to a second aspect of the present invention, there is provided a method for transferring electronic components, comprising the steps of picking up an electronic component from a supply of electronic components with a first rotary mechanism, the first rotary mechanism being in operative communication with a main rotary turret at a first transfer position, and the main turret including a plurality of turret pick heads for conveying electronic components to multiple positions adjacent to the main rotary turret; transferring the electronic component to a second rotary mechanism which is in operative communication with the first rotary turret at a second transfer position; and thereafter transferring the electronic component to the main rotary turret at a third transfer position where the second rotary mechanism is in operative communication with the main rotary turret.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1:
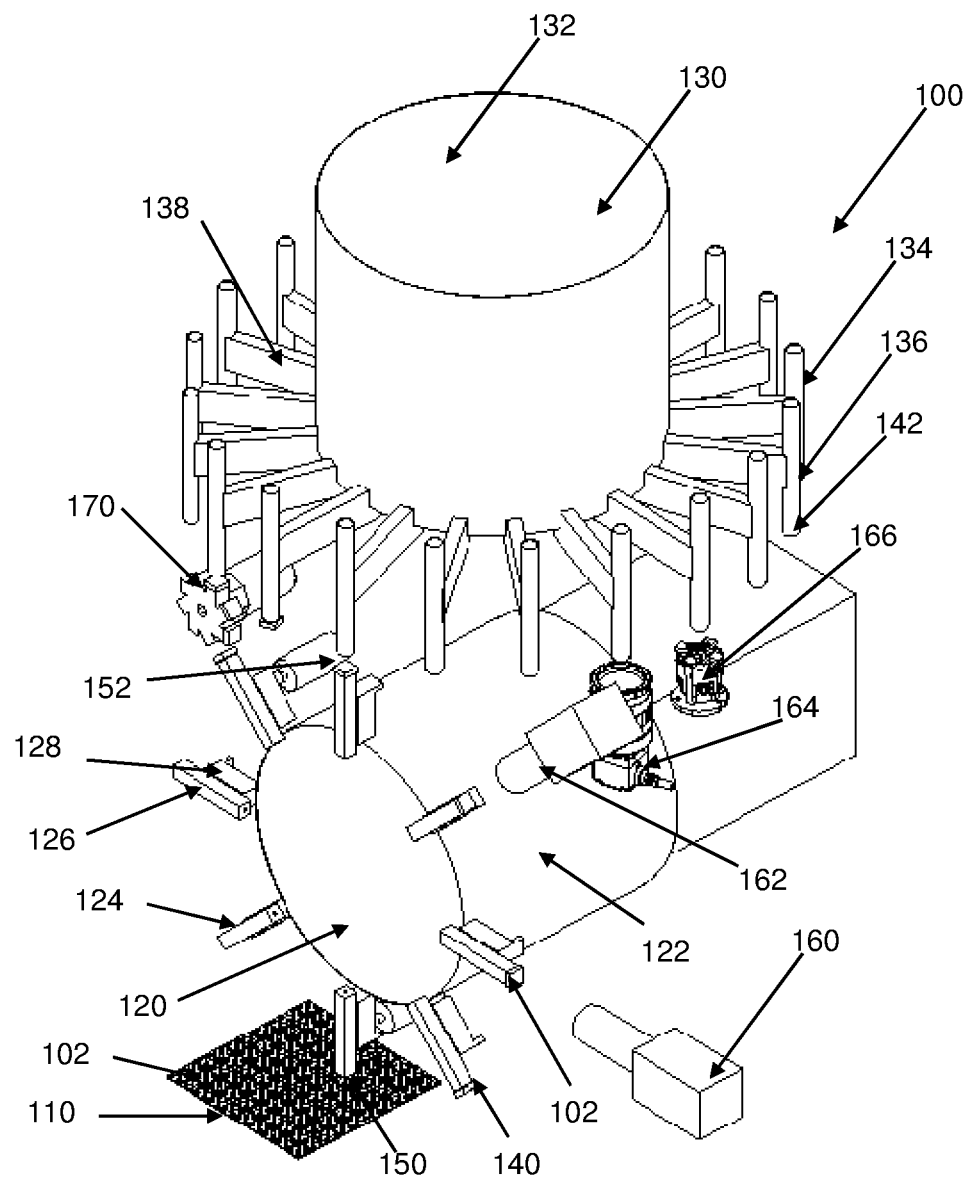
FIG. 1 shows a perspective view of an apparatus for transferring electronic devices from a supply area to a processing station according to the preferred embodiment of the present invention.

FIG. 1 shows a perspective view of an apparatus 100 for transferring electronic devices 102 from a supply area 110, such as a wafer mounted on an elastic film, to a processing station (not shown) according to the preferred embodiment of the present invention.

The apparatus 100 comprises a first rotary mechanism or first rotary turret 120 rotatable about a horizontal axis, a main rotary turret or second rotary turret 130 rotatable about a vertical axis orthogonal to the horizontal axis and a second rotary mechanism or flipping mechanism 170 rotatable about another horizontal axis parallel to the horizontal axis of the second rotary turret 130. In other words, the second rotary turret 130 is located on a horizontal plane, and the first rotary turret 120 and the flipping mechanism 170 are located on respective vertical planes.

The first rotary turret 120 comprises a cylindrical body 122 and a plurality of pick heads 124 equally spaced apart from one another at one end of the cylindrical body 122. FIG. 1 illustrates that the first rotary turret 120 has 8 pick heads 124 located 45° apart from one another around a circumference of the cylindrical body 122. However, it should be appreciated that the apparatus 100 may comprise more or fewer pick heads 124. Each pick head 124 may comprise a cantilever body 126 attached to the cylindrical body 122 via a respective connecting portion 128. The cantilever bodies 126 are directed radially outwards from the circumference of the cylindrical body 122, wherein a retrieval portion 140 for picking up an electronic component 102 is located at a distal end of each cantilever body 126. The retrieval portions 140 may pick up the electronic components 102 using any appropriate method, for instance, by vacuum suction.

Similarly, the second rotary turret 130 comprises a cylindrical body 132 and a plurality of pick heads 134 equally spaced apart from one another at one end of the cylindrical body 132 around a circumference of the cylindrical body 132. The second rotary turret 130 may comprise any suitable number of pick heads 134. Each pick head 134 may also comprise a cantilever body 136 attached to the cylindrical body 132 via a respective connecting portion 138. The cantilever bodies 136 are vertically oriented, and are parallel to the vertical rotation axis of the second rotary turret 130. A retrieval portion 142 for picking up an electronic component 102 is located at the lowest end of each cantilever body 136. The retrieval portions 142 may pick up the electronic components 102 using any appropriate method, for instance, by vacuum suction.

The first rotary turret 120 and the second rotary turret 130 are independently rotatable, and may rotate in either a clockwise direction or an anticlockwise direction. The first rotary turret 120 and the second rotary turret 130 rotate at intervals, repeatedly moving and stopping at regular intervals. Although the first rotary turret 120 and the second rotary turret 130 may rotate at any intervals, it is expedient for the rotary turrets 120, 130 to rotate at the same intervals according to a pre-designed separation of the pick heads 124, 134.

The pick heads 124 of the first rotary turret 120 are positionable at a pick up location 150 to pick up electronic components 102 from the supply area 110, and at a first transfer location 152 to transfer the electronic components 102 to the second rotary turret 130. A pick head 124 is positioned at the pick up location 150 after each rotary motion, thus allowing it to pick up an electronic component 102 from the supply area 110. The electronic components 102 that are picked up by the pick heads 124 are then transported from the pick up location 150 to the first transfer location 152 for them to be transferred to the second rotary turret 130.

As shown in FIG. 1, the pick up location 150 and the first transfer location 152 are spaced 180° apart, and the retrieval portions 140 of the pick heads 124 face downwards at the pick up location 150 and face upwards at the first transfer location 152. It should be appreciated that by transporting the electronic components 102 from the pick up location 150 to the first transfer location 152 with the first rotary turret 120, the electronic components 102 would be flipped 180°. Hence, for example, if the electrical contacts of the electronic components 102 face upwards at the supply area 110 prior to pick-up, then the electrical contacts of the electronic components 102 would face downwards at the first transfer location 152.

The pick heads 134 of the second rotary turret 130 are positionable at the first transfer location 152 to receive the electronic components 102 from the pick heads 124 of the first rotary turret 120. The retrieval portions 142 of the second rotary turret 130 are facing downwards, and may receive the electronic components 102 directly from the pick heads 124 of the first rotary turret 120. Hence, using the example in the previous paragraph, the electrical contacts of the electronic components 102 would still face downwards after the transfer from the first rotary turret 120 to the second rotary turret 130. Several processing stations (not shown), such as testing stations for testing the electronic components 102 transported by the pick heads 134 of the second rotary turret 130, may be positioned at various stopping positions of the pick heads 134 around the periphery of the second rotary turret 130, where the pick heads 134 are rotated to.

The apparatus 100 may also include a first imaging device 160 and a second imaging device 162 operable to capture images of the electronic components 102 held by the pick heads 124 of the first rotary turret 120. The first imaging device 160 and the second imaging device 162 may each be positioned at a stopping position of a respective pick head 124 between the pick up location 150 and the first transfer location 152. Assuming that the first rotary turret 120 rotates anticlockwise, FIG. 1 shows the first imaging device 160 located at 90° anticlockwise or two stopping positions away from the pick up location 150, and the second imaging device 162 is located at 135° anticlockwise or three stopping positions from the pick up location 150. The imaging devices 160, 162 may be used to perform any suitable inspection functions. For instance, the first imaging device 160 may be used to detect defects on the electronic components 102 held by the pick heads 124, and the second imaging device 162 may be used to detect the actual positions and orientations of the electronic components 102 in order to ensure accurate transfer of the electronic components 102 between the first rotary turret 120 and the second rotary turret 130. The apparatus 100 may comprise more or fewer imaging devices positioned around the periphery of the first rotary turret 120 than illustrated.

The apparatus 100 may further include a third imaging device 164, such as an up-look camera, for checking orientations of the electronic components 102 held by the pick heads 134 of the second rotary turret 130. As shown in FIG. 1, the third imaging device 164 is located at three stopping positions away (assuming the second rotary turret 130 rotates anticlockwise) from the first transfer location 152. An alignment mechanism 166 for correcting the alignment of the electronic components 102 as determined by the third imaging device 164, is located one stopping position away from the third imaging device 164. The alignment mechanism 166 properly aligns the electronic components 102 for subsequent processing by the processing stations positioned downstream from the alignment mechanism 166.

Figure 2A:
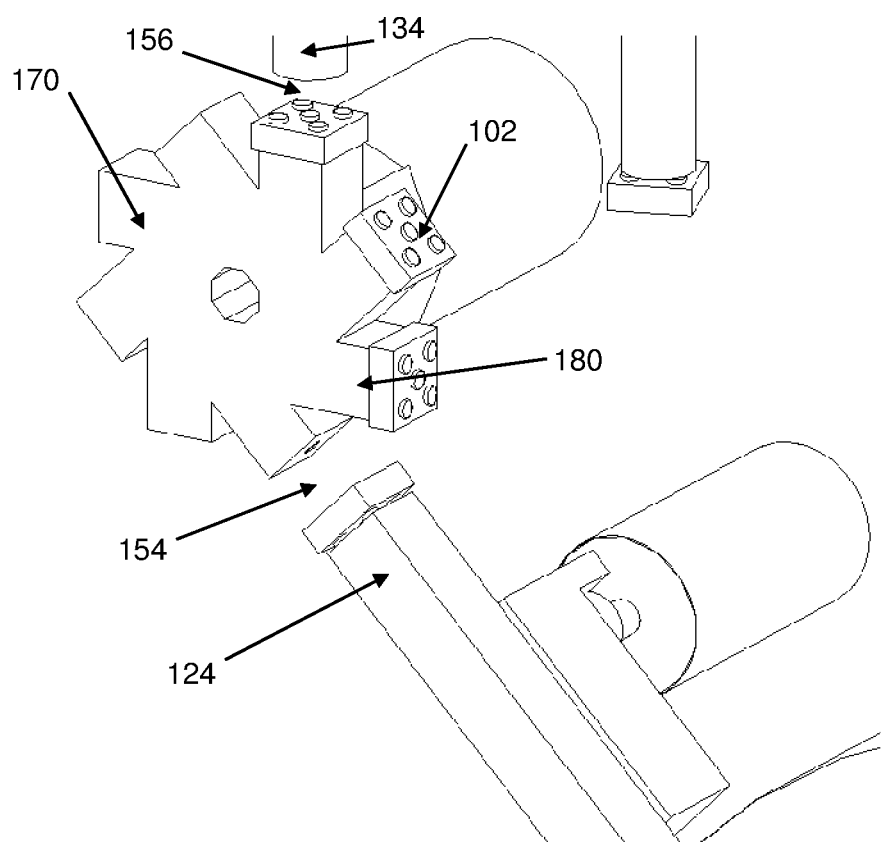
FIGS. 2A and 2B illustrate a flipping mechanism comprised in the apparatus of FIG. 1.

The flipping mechanism 170 is positioned between the first rotary turret 120 and the second rotary turret 130 for transferring the electronic components 102 between them and for flipping the electronic components 102 during the said transfer. FIG. 2A shows a perspective view of the flipping mechanism 170 and FIG. 2B shows a front view of the same.

Figure 2B:
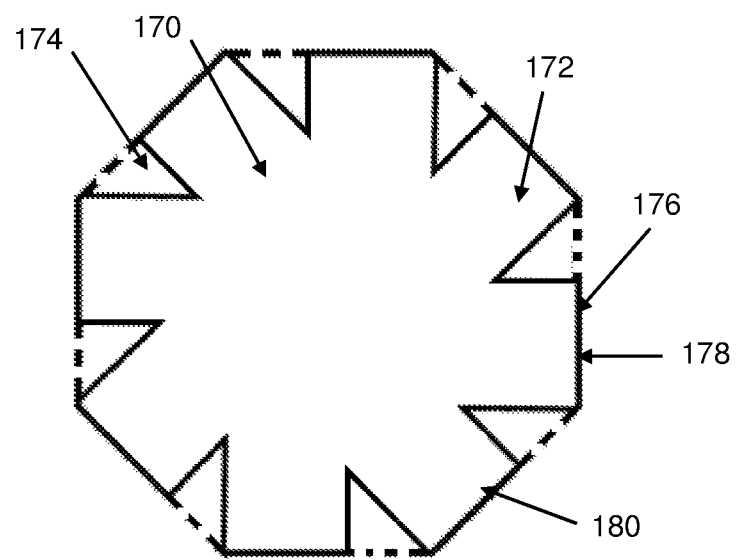

As illustrated in FIG. 2B, the structure of the flipping mechanism 170 generally comprises an octagonal cross section 172 with a respective triangular cross-sectional portion 174 (shown in broken lines) removed from each side 176 of the octagonal cross-section 172. Hence, located at a periphery of the flipping mechanism 170 are eight outwardly facing surfaces 178, each comprising a respective retrieval portion 180 located on a corresponding side surface of the octagonal cross section 172 for holding an electronic component 102 and for transporting it between the first rotary turret 120 and the second rotary turret 130. Since the flipping mechanism 170 comprises a modified octagonal cross section 172, for simplicity, the outwardly facing surfaces 178, as well as their stopping positions, will be herein described as being spaced apart by 45°. Alternatively, instead of the octagonal cross section 172, the flipping mechanism 170 may comprise a polygonal cross section with a different number of sides.

The retrieval portions 180 are oriented to face the respective pick heads 124, 134 of the first rotary turret 120 and the second rotary turret 130. The orientation of the retrieval portions 180 may change to depending on the position of the flipping mechanism 170 relative to the positions of the rotary turrets 120, 130. The flipping mechanism 170 is independently rotatable with respect to the first and second rotary turrets 120, 130, and may rotate either clockwise or anticlockwise. The flipping mechanism 170 repeatedly rotates and stops at regular intervals.

The outwardly facing surfaces 178 and retrieval portions 180 of the flipping mechanism 170 are positionable at a second transfer position 154 for transferring electronic components 102 between the flipping mechanism 170 and the first rotary turret 120, and positionable at a third transfer position 156 for transferring electronic components 102 between the flipping mechanism 170 and the second rotary turret 130. The retrieval portions 180 are oriented to face the pick heads 134 of the second rotary turret 130 at the third transfer position 156 and are oriented to face the pick heads 124 of the first rotary turret 120 at the second transfer position 154, so as to transfer the electronic components 102 between the retrieval portions 180 and the pick heads 124, 134. Hence, the first rotary turret 120 is in operative communication with the flipping mechanism 170 at the second transfer position 154 and the second rotary turret 130 is in operative communication with the flipping mechanism 170 at the third transfer position 156. After every rotation of the flipping mechanism 170, there is one retrieval portion 180 positioned at the second transfer position 154 and another retrieval portion 180 positioned at the third transfer position 156. The transfer of the electronic components 102 at the second transfer position 154 and the third transfer position 156 may thus be performed simultaneously.

The second rotary turret 130 may rotate about a clockwise rotational direction, such that the third transfer position 156 is located after the first transfer position 152 along the rotational direction of the second rotary turret 130. The second rotary turret 130 may also rotate about an anticlockwise rotational direction such that the third transfer position 156 is located before the first transfer position 152 along the rotational direction of the second rotary turret 130. In addition, the imaging devices 160, 162 may be located before the third transfer position 156 along a rotational direction, whether clockwise or anticlockwise, of the first rotary turret 120.

The position and the operation of the flipping mechanism 170 may be customized to suit process requirements. For instance, on the one hand, the flipping mechanism 170 may be used to transfer electronic components 102 from the second rotary turret 130 to the first rotary turret 120. Thus, the retrieval portion 180 of the flipping mechanism 170 at the third transfer position 156 receives the electronic component 102 from the pick head 134 of the second rotary turret 130. The flipping mechanism 170 rotates in a clockwise direction, and after three rotational intervals, the electronic component 102 held by the flipping mechanism 170 is transported to the second transfer position 154. The electronic component 102 is then transferred to the pick head 124 of the first rotary turret 120 at the second transfer position 154. On the other hand, the flipping mechanism 170 may be used to transfer electronic components 102 from the first rotary turret 120 to the second rotary turret 130. In this case, the retrieval portion 180 of the flipping mechanism 170 receives the electronic component 102 at the second transfer position 154 from the pick head 124 of the first rotary turret 120, moves it to the third transfer position 156 and transfers the electronic component 102 to the pick head 134 of the second rotary turret 130. Moreover, the transfer of the electronic components 102 between the rotary turrets 120, 130 and the flipping mechanism 170 may proceed independently but concurrently. Thus, the flipping mechanism 170 allows not only the transfer of electronic components 102 between the rotary turrets 120, 130 to proceed rapidly, but it also conveniently flips the electronic components transferred at the same time.

It should also be appreciated that by utilizing the flipping mechanism 170 to transfer the electronic components 102 between the rotary turrets 120, 130, the sides of the electronic components 102 held by the pick heads 124, 134 before the transfer would be on the same side of the electronic components 102 held by the pick heads 124, 134 after the transfer. For instance, a surface of the electronic component 102 facing away from the first rotary turret 120 would be the same surface facing away from the second rotary turret 130 after the electronic component 102 has been transferred between the rotary turrets 120, 130 indirectly through the flipping mechanism 170. This is different from a direct transfer between the rotary turrets 120, 130 at the first transfer position 152, wherein the side of the electronic components 102 held by the pick heads 124, 134 before the transfer would be different from the side of the electronic components 102 held by the pick heads 124, 134 after the transfer. Therefore, the flipping mechanism 170 provides the apparatus 100 with an option to customize the transfer process to meet specific process requirements. On the other hand, the flipping mechanism 170 may be disabled if it is not needed.

Figure 3A:
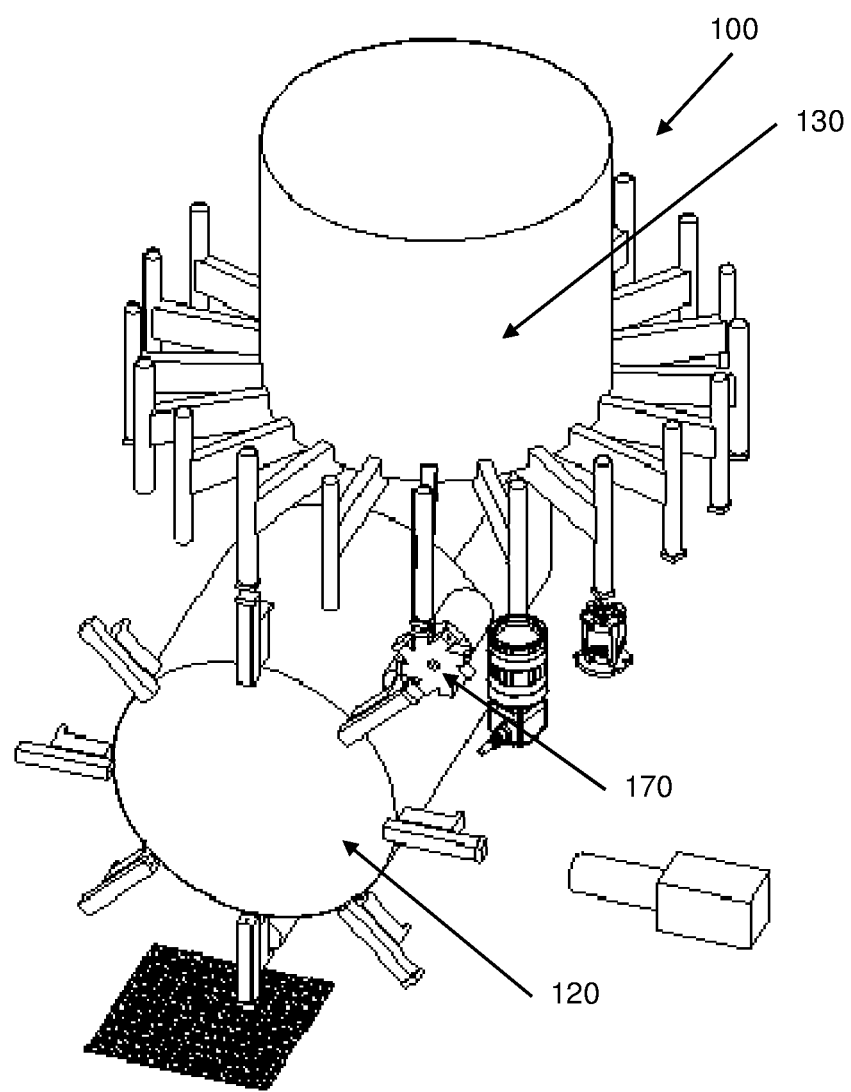
FIGS. 3A and 3B illustrate the flipping mechanism positioned at a different position from that shown in FIG. 1.

One advantage of the flipping mechanism 170 is that the position and the operation of the flipping mechanism 170 may be customized to suit process requirements. Hence, the flipping mechanism 170 may be placed at different positions between the first rotary turret 120 and the second rotary turret 130, one possible alternative position being illustrated in FIGS. 3A and 3B. It should be appreciated that in this alternative arrangement, the second imaging device 162 as illustrated in FIG. 1 has now been replaced by the flipping mechanism 170. Hence, the second imaging device 162 (not shown in FIGS. 3A and 3B) may either be moved to a different position or be removed from the apparatus 100 if it is not needed, which emphasizes the flexibility of the apparatus 100 to customize the transfer process to meet specific process requirements. The flipping mechanism 170 may either be used to transfer the electronic components 170 from the second rotary turret 130 to the first rotary turret 120, or to transfer the electronic components 170 from the first rotary turret 120 to the second rotary turret 130.

Figure 3B:
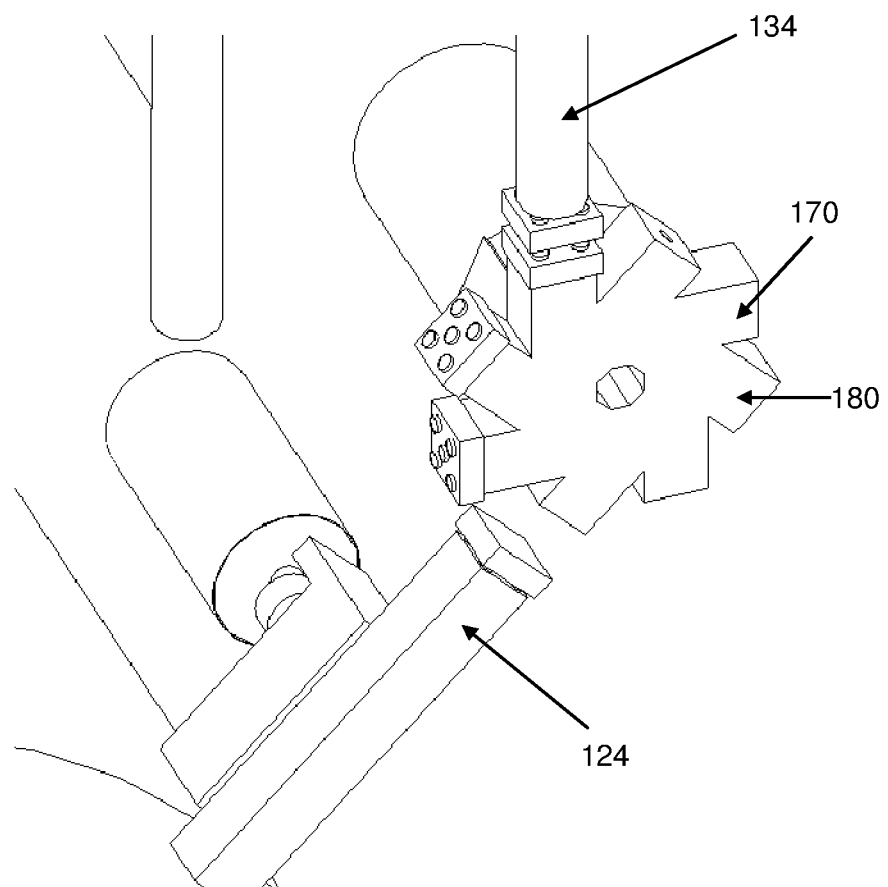

FIG. 3B shows the flipping mechanism 170 positioned between the first rotary turret 120 and the second rotary turret 130. The retrieval portions 180 are oriented to face the respective pick heads 124, 134 of the first rotary turret 120 and the second rotary turret 130. Hence, the retrieval portions 180 of the flipping mechanism 170 comprise a reverse orientation compared to the flipping mechanism 170 shown in FIGS. 2A and 2B, because the flipping mechanism 170 is now positioned on the right side of the first rotary turret 120 instead of the left (from a front view of the apparatus 100). The orientation of the retrieval portions 180 may change to depending on the position of the flipping mechanism 170 relative to the positions of rotary turrets 120, 130.

Although the present invention has been described in considerable detail with reference to certain embodiments, other embodiments are possible.

For example, the apparatus 100 may include more than one flipping mechanism 170. For instance, the apparatus 100 may include two flipping mechanisms 170, where one flipping mechanism 170 is at the position shown in FIG. 1 and another flipping mechanism 170 is at the position shown in FIG. 3A.

Therefore, the spirit and scope of the appended claims should not be limited to the description of the embodiments contained herein.

The invention claimed is:

1. An apparatus for transferring electronic components, comprising:
  a main rotary turret comprising a plurality of turret pick heads for conveying electronic components to multiple positions adjacent to the main rotary turret;
  a first rotary mechanism configured for picking up electronic components from a supply of electronic components, the first rotary mechanism being in operative communication with the main rotary turret at a first transfer position; and a second rotary mechanism that is in operative communication with the main rotary turret at a third transfer position, and which is further in operative communication with the first rotary mechanism at a second transfer position.

2. The apparatus according to claim 1, wherein a plurality of retrieval portions of the second rotary mechanism configured for holding electronic components is located at outwardly facing surfaces on a periphery of the second rotary mechanism.

3. The apparatus according to claim 2, wherein the second rotary mechanism has a polygonal cross-section with the outwardly facing surfaces located on side surfaces of the polygon.

4. The apparatus according to claim 2, wherein the plurality of retrieval portions are oriented to face the plurality of turret pick heads at the third transfer position so as to transfer the electronic components between the turret pick heads and the retrieval portions.

5. The apparatus according to claim 2, wherein a plurality of retrieval portions of the second rotary mechanism for holding the electronic components are oriented to face at least one pick head of the first rotary mechanism at the second transfer position so as to transfer the electronic components between the at least one pick head and the retrieval portions.

6. The apparatus according to claim 1, wherein the second rotary mechanism is operative to transfer electronic components between the second and third transfer positions, such that a surface of an electronic component facing away from the first rotary mechanism is the same as the surface of the electronic component facing away from the main rotary turret after the said transfer.

7. The apparatus according to claim 1, wherein rotary axes of the first rotary mechanism and second rotary mechanism respectively are generally orthogonal to a rotary axis of the main rotary turret.

8. The apparatus according to claim 7, wherein the main rotary turret is located on a horizontal plane and the first and second rotary mechanisms are located on respective vertical planes.

9. The apparatus according to claim 7, wherein the rotary axes of the first and second rotary mechanisms are parallel to each other.

10. The apparatus according to claim 1, wherein the main rotary turret is configured to rotate in a rotational direction, and the third transfer position is located before the first transfer position along the rotational direction of the main rotary turret.

11. The apparatus according to claim 1, wherein the main rotary turret is configured to rotate in a rotational direction, and the third transfer position is located after the first transfer position along the rotational direction of the main rotary turret.

12. The apparatus according to claim 11, further comprising an imaging device for inspecting an electronic component held by the first rotary mechanism at a position before the third transfer position along a rotational direction of the first rotary mechanism.

13. A method for transferring electronic components, comprising the steps of:
 picking up an electronic component from a supply of electronic components with a first rotary mechanism, the first rotary mechanism being in operative communication with a main rotary turret at a first transfer position, and the main turret including a plurality of turret pick heads for conveying electronic components to multiple positions adjacent to the main rotary turret;
 transferring the electronic component to a second rotary mechanism which is in operative communication with the first rotary turret at a third transfer position; and thereafter
 transferring the electronic component to the main rotary turret at a second transfer position where the second rotary mechanism is in operative communication with the main rotary turret.

\* \* \* \* \*